United States Patent
Krämer et al.

(10) Patent No.: US 7,981,841 B2
(45) Date of Patent: Jul. 19, 2011

(54) RESISTIVE TYPE SUPER CONDUCTIVE CURRENT-LIMITING DEVICE COMPRISING A STRIP-SHAPED HIGH-$T_c$-SUPER CONDUCTIVE PATH

(75) Inventors: Hans-Peter Krämer, Erlangen (DE); Wolfgang Schmidt, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 921 days.

(21) Appl. No.: 11/664,625

(22) PCT Filed: Sep. 27, 2005

(86) PCT No.: PCT/EP2005/054852
§ 371 (c)(1),
(2), (4) Date: Apr. 4, 2007

(87) PCT Pub. No.: WO2006/037741
PCT Pub. Date: Apr. 13, 2006

(65) Prior Publication Data
US 2008/0070788 A1 Mar. 20, 2008

(30) Foreign Application Priority Data
Oct. 4, 2004 (DE) .................. 10 2004 048 646

(51) Int. Cl.
*H01L 39/24* (2006.01)
(52) U.S. Cl. ........ 505/924; 505/211; 505/237; 505/238; 505/705; 336/DIG. 1; 428/930
(58) Field of Classification Search .................. 505/211, 505/237, 238, 430, 705, 924; 428/930; 336/DIG. 1
See application file for complete search history.

(56) References Cited

U.S. PATENT DOCUMENTS

| | | | |
|---|---|---|---|
| 3,363,207 A | | 1/1968 | Brechna |
| 3,869,686 A | * | 3/1975 | Benz .......................... 335/216 |
| 4,044,765 A | * | 8/1977 | Kline ....................... 604/170.01 |
| 4,178,677 A | * | 12/1979 | Weisse et al. .................. 29/605 |
| 4,921,833 A | | 5/1990 | Takano |
| 5,180,707 A | * | 1/1993 | Gao et al. ...................... 505/471 |
| 6,440,904 B1 | | 8/2002 | Chen et al. |
| 6,522,236 B1 | | 2/2003 | Ries |

(Continued)

FOREIGN PATENT DOCUMENTS

DE 198 36 860 2/2000

(Continued)

OTHER PUBLICATIONS

International Search Report, mailed Jan. 31, 2006 and issued in corresponding International Patent Application No. PCT/EP2005/054852.

(Continued)

*Primary Examiner* — Kiley Stoner
*Assistant Examiner* — Paul A Wartalowicz
(74) *Attorney, Agent, or Firm* — Staas & Halsey LLP

(57) ABSTRACT

The conductive path of the current-limiting device is made of a strip-shaped super conductor, whereby the structure thereof has a metallic strip, at least one oxidic buffer, a type $AB_2Cu_3O_x$ super conductive layer and a metal cover layer which is arranged thereon. An intrinsically stable bifilar coil is embodied with said super conductor, and a distance is maintained between adjacent coil windings, wherein a distance maintainer is arranged which is transparent to the coolant.

21 Claims, 2 Drawing Sheets

U.S. PATENT DOCUMENTS 6,552,415 B1 4/2003 Paul et al.
2004/0266628 A1* 12/2004 Lee et al. .................. 505/238

FOREIGN PATENT DOCUMENTS

| | | |
|---|---|---|
| DE | 102 30 618 | 1/2004 |
| EP | 0 292 959 | 11/1988 |
| EP | 0 417 329 | 3/1991 |
| EP | 0 444 702 | 9/1991 |
| EP | 0 503 448 | 9/1992 |
| EP | 0 911 889 | 4/1999 |
| WO | WO 99/33122 | 7/1999 |
| WO | WO 00/10208 | 2/2000 |

OTHER PUBLICATIONS

German Patent Office Action, mailed Sep. 6, 2005 and issued in corresponding German Patent Application No. 10 2004 048 646.8-33.

* cited by examiner

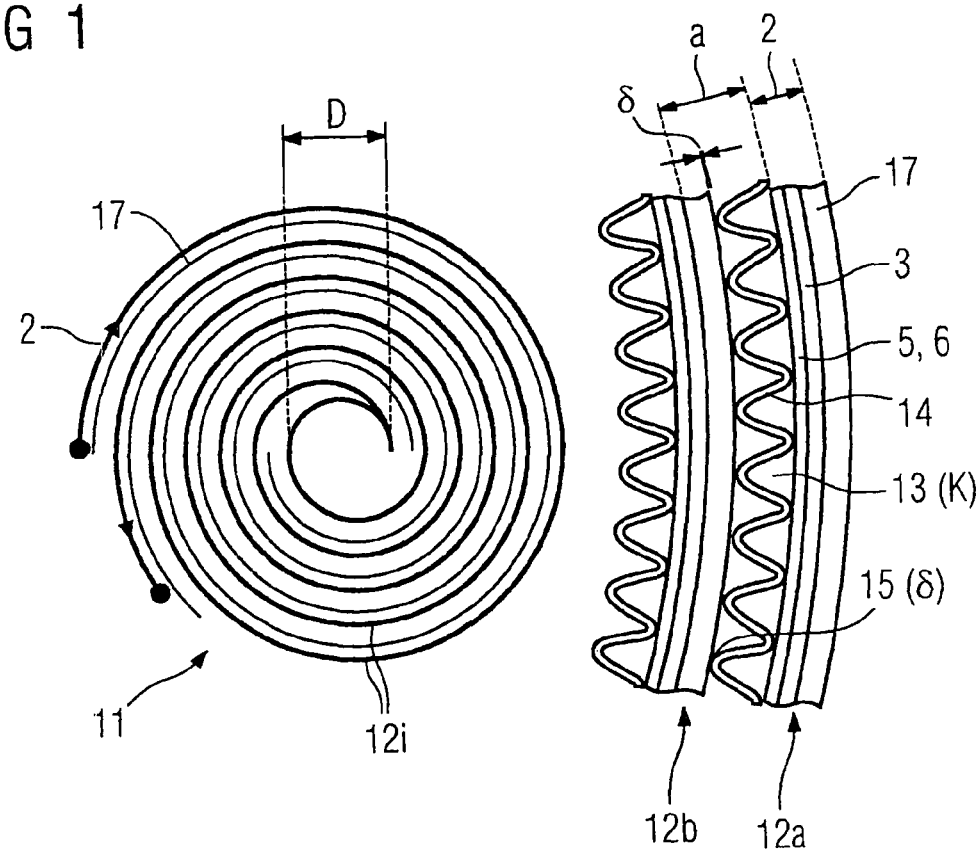
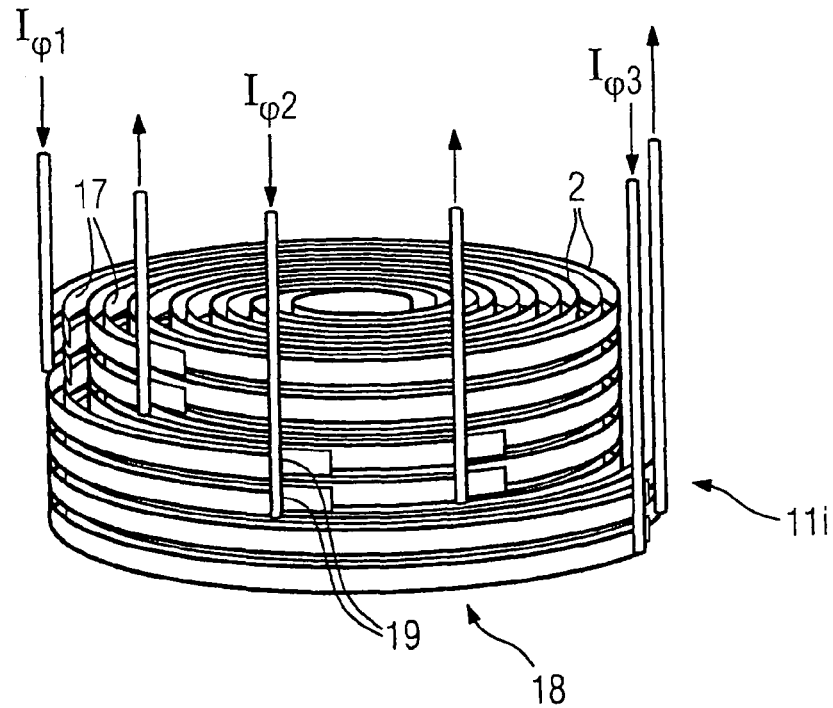

RESISTIVE TYPE SUPER CONDUCTIVE CURRENT-LIMITING DEVICE COMPRISING A STRIP-SHAPED HIGH-$T_c$-SUPER CONDUCTIVE PATH

CROSS REFERENCE TO RELATED APPLICATIONS

This application is based on and hereby claims priority to PCT Application No. PCT/EP2005/0054852 filed on Sep. 27, 2005 and German Application No. 10 2004 048 646.8 filed on Oct. 4, 2004, the contents of which are hereby incorporated by reference.

BACKGROUND

The invention relates to a superconducting current-limiter device of the resistive type, whose conductor track is formed by a superconductor in the form of a strip, whose oxidic high-$T_c$ superconductor material of the $AB_2Cu_3O_x$ type is applied to a substrate strip composed of a normally conductive substrate metal, with A being at least one rare earth metal including yttrium, and B being at least one alkaline earth metal. In this case, the conductor track is in the form of a bifilar coil, with a distance through which a coolant can flow being maintained between adjacent coil turns. A corresponding current-limiter device is disclosed in EP 0 503 448 A2.

Superconducting metal-oxide compounds with high critical temperatures $T_c$ of above 77 K have been known since 1986, which are therefore referred to as high-$T_c$ superconductor materials, or HTS materials, and, in particular, allow a liquid-nitrogen ($LN_2$) cooling technique. Metal-oxide compounds such as these include in particular cuprates based on specific substance systems, for example of the $AB_2Cu_3O_x$ type, with A being at least one rare earth metal including yttrium, and B being at least one alkaline earth metal. The main representative of this substance system of the so-called 1-2-3-HTS type is so-called YBCO ($Y_1Ba_2Cu_3O_x$ where $6.5 \leq x \leq 7$).

The aim is to deposit this known HTS material on different substrates for different purposes, in which case the general aim is to achieve a superconductor material with as high a phase purity as possible. In particular, metallic substrates are therefore provided for conductor applications (see, for example, EP 0 292 959 A1).

In the case of the current-limiter device which is disclosed in the EP-A2 document cited initially, a type of superconductor in the form of a strip, inter alia, is used and has a substrate which is provided with a coating composed of the HTS material. In order to form the current-limiter device, this conductor can be wound as a bifilar coil, with a spacer in the form of strip in each case being arranged for the construction process between two successive conductor sections or coil turns. This bifilar coil should then be held on a base plate which is porous or is provided with a large number of holes. Once the coil has been mounted on this base plate, the spacers arranged between the conductor sections are finally removed again. The distance between the individual coil turns and the porosity of the base plate thus result in flow paths between the coil turns for a coolant for cooling the superconducting material.

SUMMARY

One possible object of the present invention is to improve this current-limiter device having the features mentioned initially, such that its design is less complex.

The inventors propose a current-limiter device having the features mentioned initially and having a configuration of its superconductor in the form of a strip which at least contains at least one buffer layer, which is arranged between the substrate strip and the superconducting layer and is composed of an oxidic buffer material and a covering layer which is applied to the superconducting layer and is composed of a normally conductive covering metal. In addition, the coil with the superconductor is intended to be designed to be intrinsically stable, and at least one spacer, which is transparent for the coolant, is intended to be arranged between adjacent coil turns.

The advantages associated with this embodiment of the current-limiter device are, in particular, that the winding of the bifilar coils can be produced together with the spacer in a common process. The configuration of the coil is accordingly simple. Furthermore, the use of the normally conductive covering layer allows contact to be made with the superconductor at the ends of the winding without any problems. In this case, there is no need for any special mount body for the coil, in order to mechanically reinforce it.

In this case, their features can also be used in conjunction with one another. It is thus particularly advantageous for the superconductor to be arranged with its substrate strip side on the outside in the coil.

Furthermore, an insulation film can be arranged in the coil, between the spacer and the respectively adjacent substrate strip of the superconductor or of the coil turn.

A spacer can preferably be used which is in the form of at least one corrugated spacing film. Spacing films such as these allow flow paths for the coolant to be formed in a simple manner.

In order to ensure that the design of the coil is sufficiently intrinsically stable, its superconductors can be adhesively bonded to one another together with the spacer by a synthetic resin, leaving the required coolant paths free. The adhesive bonding is in this case expediently carried out only in the mutually touching areas of these parts.

The mutual separation between the coil turns should be at least 1 mm in order to ensure a sufficiently large cross section for the coolant to flow through.

It can be regarded to be particularly advantageous if at least one contact-making element composed of a normally conductive contact-making material is provided at least on one longitudinal side of the structure of the superconductor, between its covering layer and its substrate strip, in which case the relationship for the normally conductive limiting state of the current-limiter device should be:

$$R_k > 3 \cdot R_L, \text{ preferably } R_K > 10 \cdot R_L$$

where RL is the electrical resistance of the configuration without the contact-making element over the entire length of the conductor track, and RK is the resistance of the at least one contact-making element over the entire length. In this case, the overall length should be understood as meaning the length of the superconductor which is in the form of a strip that is available between superconductivity and normal conductivity of the current-limiter device for the switching process. The resistance RL is in this case formed from the resistance of the substrate strip, of the covering layer and the maximum possible normally conductive resistance of the superconducting layer, connected in parallel. If a plurality of contact-making elements are provided, then these likewise form a parallel circuit, with a total resistance whose value is RK. This value can be selected in a known manner by the choice of material for the at least one contact-making element, or the electrical resistivity p of its material, and by the thickness or the available conductive cross section.

The advantages associated with this embodiment of the current-limiter device are, in particular, that the metallic substrate strip and the normally conductive covering layer, and hence also the superconducting layer which is conductively connected to it, seen in the direction in which the current is passed, are brought into electrical contact with one another, at least in the subareas along the length of the structure, and are thus at a single electrical potential, even in the case of a quench. This suppresses any flashover across the buffer layer.

In particular, the following measures can also be provided individually, or else in conjunction, for this refinement of the current-limiter device:

In general, the average thickness of the at least one contact-making element is less than 1 μm, preferably less than 0.5 μm. This is because appropriately thin layers are advantageously adequate for a sufficient galvanic connection, since they allow only a galvanic connection, but cannot carry higher currents.

In particular, gold, silver or copper, or an alloy with the respective element, or at least one further alloying partner, can be provided as the material for the at least one contact-making element. Appropriate contact-making elements can be applied to the longitudinal sides of the conductor structure, for example by soldering processes, or can be produced by the solder material. Since solder need be applied only to the sides, the risk of damage to the HTS material is correspondingly low.

It is particularly advantageous for the contact-making element to be in the form of a sheathing element which surrounds the conductor structure on all sides, in which case a sheathing element such as this may be in the form of an electrochemical coating. Coatings such as these can be produced in a particularly simple manner, protecting the HTS material, since only a small thickness is required.

Instead of an embodiment of special contact-making elements, at least one of the side edges of the conductor structure in the current-limiter device can be mechanically deformed, at least in subareas, such that the covering layer and the substrate strip make electrical contact. The advantages associated with this embodiment of the current-limiter apparatus are, in particular, that the metallic substrate strip and the normally conductive covering layer, and hence also the superconducting layer that is galvanically connected to it, are brought into electrical contact with one another, at least in the subareas along the length of the structure, seen in the direction in which the current is passed, and are thus at a single electrical potential even in the event of a quench. This suppresses any flashover across the buffer layer. Corresponding deformation on at least one the longitudinal sides of the conductor structure is acceptable because, normally, the superconducting characteristics of the superconducting layer become worse in any case, by virtue of the production techniques, at the side edges. In this case, the electrical contact on the at least one side edge can be formed by crushing or rolling deformation, and corresponding deformations can easily be implemented.

In order to prevent an electrical flashover across the at least one buffer layer between the covering layer with the superconducting layer on the one hand and the metallic substrate strip on the other hand, these parts can also be kept at the same potential, by choosing the material of the buffer layer, at least in subareas, to be a material with adequate electrical conductivity for this purpose. The material is advantageously chosen for this purpose such that the contact resistance between the superconducting layer and the substrate strip is at most $10^{-3}$ $\Omega \cdot cm^2$, preferably at most $10^{-5}$ $\Omega \cdot cm^2$. In order to satisfy this condition, the material of the buffer layer can preferably have a mean resistivity of at most 5000 μΩ·cm, preferably of at most 500 Ω·cm². Particularly suitable materials for this purpose are those of the La—Mn—O, Sr—Ru—O, La—Ni—O or In—Sn—O type.

BRIEF DESCRIPTION OF THE DRAWINGS

These and other objects and advantages of the present invention will become more apparent and more readily appreciated from the following description of the preferred embodiments, taken in conjunction with the accompanying drawings of which:

FIG. 1 shows the bifilar structure of a disk-type coil of the current-limiter device, as well as a detail of the latter in each case in the form of a plan view;

FIG. 2 shows the connection of a plurality of such disk-type coils to form a three-phase arrangement, viewed obliquely;

DETAILED DESCRIPTION OF THE PREFERRED EMBODIMENT

Figure 3:
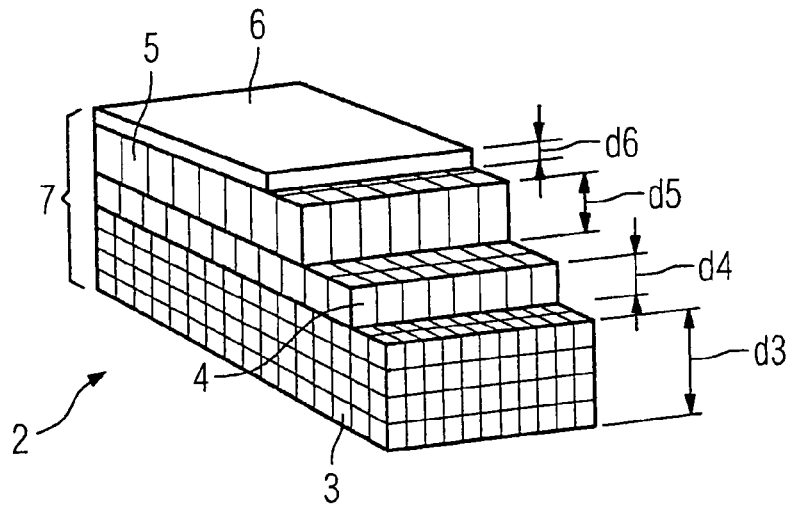
FIG. 3 shows the configuration of a YBCO strip conductor for a disk-type coil as shown in FIG. 1 or 2, viewed obliquely.

Reference will now be made in detail to the preferred embodiments of the present invention, examples of which are illustrated in the accompanying drawings, wherein like reference numerals refer to like elements throughout.

In this case, corresponding parts in the figures are in each case provided with the same reference symbols.

FIG. 1 shows the most important parts of a coil which is annotated 11 in general, for the proposed current-limiter device, as well as an enlarged illustration of a detail of this coil. In this case, the coil is designed to be intrinsically stable with a YBCO strip conductor 2, on the basis of which preferred embodiments will be explained in more detail with reference to FIGS. 3 to 5. A metallic substrate strip of the strip conductor, annoted 3, and so-called functional layers, annoted 5, 6, are also shown in the figure, with these layers being formed by a YBCO layer with the buffer layer located underneath it, and a metallic covering layer located on the YBCO layer. In this case, an intrinsically stable configuration of the coil means a configuration which does not need any special mount body on which the winding of the coil must necessarily be applied, for mechanical robustness reasons. Specifically, the superconducting strip conductor that is used may be in the form of wound disk-type coils, with the capability for access for a coolant K between adjacent coil or conductor turns 12i, and 12a, b, respectively. In order to keep the inductance low, a coil is wound in a bifilar form, that is to say the current flows in opposite directions in adjacent coil turns or layers. In consequence, the full phase voltage at a maximum may occur between the two outer ends of the coil winding. The coil turns 12i must therefore be insulated from one another. Insulation byby a film 17, for example, is suitable for this purpose, with this film 17 being a few millimeters broader than the conductor 2 that is in the form of a strip. Furthermore, cooling channels 13 should be provided, in order to allow access for the coolant K. Channels such as these can advantageously be produced by winding in spacers 14, preferably with a corrugated shape, between the individual coil turns. The internal diameter of the coil is in this case governed by the minimum permissible radius of curvature for the strip conductor 2, for which the critical current Ic is not yet degraded. This requirement can be satisfied without any problems by the minimum diameter D of the winding of the coil 11 in the order of magnitude of 100 mm. Since the superconducting YBCO layer of the strip conductor 2 can be loaded to a greater extent in compression than in tension, the layer side of the strip conductor should point towards the inside of the coils. The entire winding of the coil must, of course, be sufficiently mechanically robust; that is to say it must be possible to handle it during assembly of the active part, and it must be possible to withstand the forces that occur if the coolant K boils, without any problems. For this purpose, the complete winding of the coil can advantageously be encapsulated by vacuum impregnation with a suitable synthetic resin, whose parts are annoted 15 in the figure. The synthetic resin should be able to run out of the respective cooling channels 13 before curing, so that only locally discrete thin synthetic resin areas 15 remain on the surfaces, with respect to the thickness 8 on the functional layers 5, 6 and on the insulation film 17 is in the order of magnitude between 10 and 100 µm. This synthetic resin layer in this case represents a part of the insulation between the coil turns 12$i$.

The configuration illustrated in FIG. 1 results in an intrinsically stable coil element 11, a plurality of which can be connected in parallel and in series, as shown in FIG. 2 on a suitable supporting structure. FIG. 2 shows a corresponding connection of a plurality of coil elements 11$i$ to form a corresponding three-phase arrangement 18. Solder contacts have been proven for connection purposes. The required contacts 19 can be placed on the metallic covering layer or on the substrate side of the strip conductor. The contact between the incoming and outgoing strip on the internal radius of the respective coil can also be provided by soldering over a length of a few centimeters.

The conductor separation a between adjacent coil turns 12$i$ is governed by the thickness of the insulation film 17, the synthetic-resin layer areas 15, the material thickness of the spacer 14 and by the radial width of the cooling channels 13. In this case, it is assumed that the warming-up phase of the conductor winding takes place virtually adiabatically in the event of quenching; the Joulean heat that is released, for example of about 200 W/cm$^2$ is in this case passed into the conductor; in this case, less heat can be dissipated via the boiling film, which can form about 1 ms. The conductor separation therefore primarily influences the cooling-down phase. If the conductors are too close together, too little liquid will be passed through, and the cooling-down time will be lengthened. In the extreme case of a conductor winding without any cooling channels, only the surface of the coil would be available for heat exchange. A second viewpoint for the size of the winding separation a is the force effect resulting from expansion of the cooling liquid on vaporization. Both aspects, specifically flow in the cooling channel 13 and pressure build-up, can be determined by the transparent spacers 14 provided, and by their dimensions. If, for example, a YBCO strip conductor 2 with a width of 10 mm is provided, and the film-like spacer 14 projects for a total of 5 mm, that is to say 2.5 mm at each edge, then this results in the ratio between the separation and the conductor height being 3 mm/15 mm=0.2. Since a strip winding for the configuration is mechanically relatively robust and therefore withstands correspondingly high forces, a conductor separation of 1 millimeter is possible. In this situation, a radial extent of about 0.6 mm still remains for the cooling channel 13 (conductor strip: approx. 0.15 mm; insulation, approx. 0.2 mm; resin layer: approx. 0.05 mm). This then results in an advantageous aspect ratio of 0.6 mm/15 mm=0.04.

Preferred embodiments of YBCO strip conductors 2 for the coil 11 or the coil arrangement 18 are illustrated in the following FIGS. 3 to 5.

The strip conductor that is indicated in FIG. 3 and is annoted 2 in general is based on embodiments of so-called YBCO strip conductors or "YBCO Coated Conductors" that are known per se. In the figure, 3 denotes a substrate strip composed of a normally conductive substrate metal of thickness d3, 4 denotes at least one buffer layer applied to it and composed of oxidic buffer material of thickness d4, 5 denotes an HTS layer composed of YBCO of thickness d5, 6 denotes Ea covering layer composed of a normally conductive covering metal of thickness d6 as a protective and/or contact layer, which may also be composed of a plurality of individual layers which are in close contact with one another, and 7 shows the conductor structure formed from these four parts. In this case, these parts can be formed as follows:

a metallic: substrate strip 3 composed of nickel, nickel alloys or stainless steel with a thickness d3 of about 20 to 250 µm, a buffer layer or a buffer layer system composed of one or more individual layers of oxides such as CeO2 or YSZ with a thickness d4 of about 0.1 µm to 1 mm, an HTS layer 5 composed of YBCO with a thickness D5 of between about 0.3 and 3 µm, and a metallic covering layer 6 composed of silver, gold or copper, with a thickness d6 of between 0.1 and 1 µm.

A corresponding strip conductor has a width of a few millimeters to a few centimeters. Its superconducting current carrying capability is governed by the YBCO layer 5, that is to say by its critical current density, while the thermal, mechanical and normally conductive characteristics are dominated by the substrate strip 3 and the covering layer 6, because of the greater thickness d3. In this case, the substrate strip together with the buffer layer forms a substrate for virtually monocrystalline growth of the YBCO. The substrate strip material and the buffer layer material must not differ too greatly from YBCO in terms of the thermal coefficients of expansion and their crystallographic lattice constants. The better the match, the higher is the crack-free layer thickness, and the better the crystallinity of the YBCO. Furthermore, for high critical current densities in the MA/cm$^2$ range, it is desirable for the crystal axes in adjacent crystallites to be aligned as parallel as possible. This requires just such an alignment at least in the uppermost buffer layer in order that the YBCO can be growth heteroepitaxially. Such virtually monocrystalline flexible substrate buffer systems are preferably prepared using three processes:

so-called "Ion Beam Assisted Deposition (IBAD)" of generally YSZ or MgO on untextured metal strips, so-called "Inclined Substrate Deposition (ISD)" of YSZ or MgO on untextured metal strips, so-called "Rolling Assisted Biaxially Textured Substrates (RABiTS)", that is to say substrates provided with cube-type texturing by rolling and heat treatment, with a heteroepitaxial buffer system.

The functional layers 4 to 6 to be deposited on the substrate strip are produced in a manner known per se by vacuum coating processes (PVD), chemical deposition from the gas phase (CVD) or from chemical solutions (CSD).

Comparatively thin intermediate layers, which are formed during the production of the structure or during the deposition of the individual layers in particular on the basis of diffusion processes, can, of course, be provided between the individual layers of the conductor structure 7, as well.

In comparison to the ceramic plate conductors which are known for YBCO thin-film current limiters, the substrate strip 3 in the case of strip conductors of the type described above is electrically conductive, that is to say it can thus carry the limited current and can act as a shunt. However, in the case of the conductor structure 7 indicated above in FIG. 3, the HTS layer 5 and the substrate strip 3 would normally be insulated from one another via the at least one buffer layer 4. As soon as the current limiter device changes to its limiting state, that is to say becomes normally conductive and builds up a voltage along the conductor track, the breakdown field strength of the known buffer layer materials, which is in the order of magnitude of 100 kV/mm=10 V/0.1 µm, will quickly be exceeded. This means that the buffer layer 4 would then flash over in an uncontrolled manner. Because of this problem, a sufficiently good electrical contact between the superconducting layer 5 and the metallic substrate strip 3 is advantageously and preferably provided over the entire conductor length for use of strip conductors in the current-limiter device. The refinements of the conductor configuration 7 as explained above and as shown in FIG. 3 can preferably be used for this purpose.

According to a first refinement option, the at least one buffer layer 4 is designed in such a manner than an electrical conductivity is provided, which is sufficient for potential equalization between the superconducting layer 5 and the substrate strip 3, between the superconducting layer 5 and the substrate strip 3, at least in subareas, effectively in island-like areas, but preferably over the entire common extent. This can be achieved in particular by providing a contact resistance of at most $10^{-3}$ $\Omega \cdot cm^2$, preferably of at most $10^{-5}$ $\Omega \cdot cm^2$, between the YBCO layer 5 and the substrate strip 3. In particular, an appropriate contact resistance can be selected by choosing the material for the buffer layer 4 to be a material which has a mean resistivity of at most 5000 µΩ·cm, preferably of at most 500 µΩ·cm. Appropriate materials, which are also matched in terms of the crystalline dimensions of the YBCO material, are La—Mn—O, Sr—Ru—O, La—Ni—O or In—Sn—O (so-called "ITO").

According to a second refinement option, a continuous contact is provided over the entire length of the conductor 2 from the outside, on or around the conductor structure 7. In this case, the conductor structure 7 shown in FIG. 3 is equipped with a special contact-making element, at least on one longitudinal side. This contact-making element is composed of an electrically highly conductive material such as gold, silver or copper, or an alloy with the respective chemical element. The task of the contact-making element is to ensure a galvanic connection between the superconducting layer 5 and the normally conductive covering layer 6 which is electrically connected to it, on the one hand, and the lower normally conductive substrate strip 3 on the other hand, on the respective longitudinal side or edge. This results in these parts being at the same electrical potential when the current-limiter device is in the operating state, because of the mutual galvanic connection.

The material cross section of the at least one contact-making element is advantageously of such a size that, in practice, this does not act as an electrical shunt for the limited current. This can be ensured by the choice of material and/or the mean thickness of the contact-making element. The dimension rule is advantageously:

$R_K > 3 \cdot R_L$, preferably $R_K > 10 \cdot R_L$.

In this case, $R_L$ is the electrical resistance of the entire conductor structure 7 without the contact-making element, measured over the entire length of the conductor track. The resistance $R_L$ is in this case composed of the resistance of the substrate strip 3, of the covering layer 6 and the maximum possible resistance of the superconducting layer 5 when it is normally conductive, connected in parallel. $R_K$ is the resistance of all the parallel-connected contact-making elements over this entire length.

The value $R_K$ can be selected in a known manner by the choice of material for the at least one contact-making element and the electrical resistivity $\rho_K$ of its material, as well as by the thickness $d_K$ and the available electrically conductive cross section.

Taking account of the abovementioned relationship, the thickness $d_K$ is in general less than 1 µm, preferably less than 0.5 µm.

For example, contact-making elements can be fitted to the sides of the conductor structure 7 by soldering processes. In this case, of course, the respective contact-making element can also to some extent cover the upper flat surface of the covering layer 6 and/or the lower flat surface of the substrate strip 3.

Figure 4:
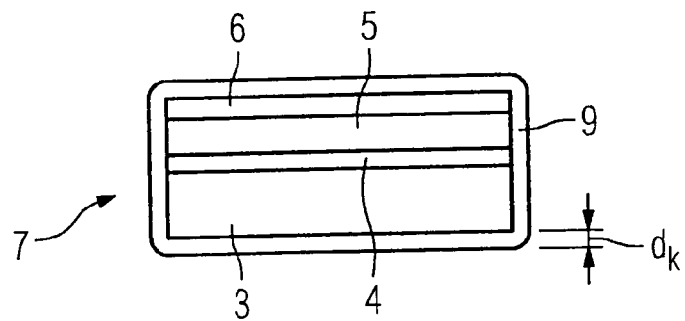
FIG. 4 shows a second embodiment of the configuration of a YBCO strip conductor for a disk-type coil as shown in FIG. 1 or 2, in the form of a cross-sectional view.

As shown in FIG. 4, it is also possible and particularly advantageous for the at least one contact-making element to be in the form of a sheathing element 9 which surrounds the conductor structure 7 on all sides. A corresponding sheathing element may for example, be produced from a normally conductive wire mesh or a surrounding wire winding, or from surrounding wire spinning, or in the form of a wire nonwoven. Instead of wires it is, of course, also possible to provide strips for this purpose. A sheathing contact-making element 9 can also particularly advantageously be produced by an electrochemical coating process. Corresponding layers of little thickness $d_k$ in the abovementioned order of magnitude can be formed in a simple manner and in particular without any adverse effect on the superconducting characteristics of the superconducting layer 5.

According to a third refinement option, a different contact is provided at least in subareas of at least one of the side edges of the conductor structure 7 of the conductor 2, to be precise with the structure being deformed in this area by mechanic deformation of the structure, for example by appropriate crushing or rolling deformation, such that the covering layer 6 and the substrate strip 3 make electrical contact. There are generally no problems in deformation in these areas, because the superconducting characteristics of the superconducting layer 5 are frequently poorer there than in the central area of the conductor.

Figure 5:
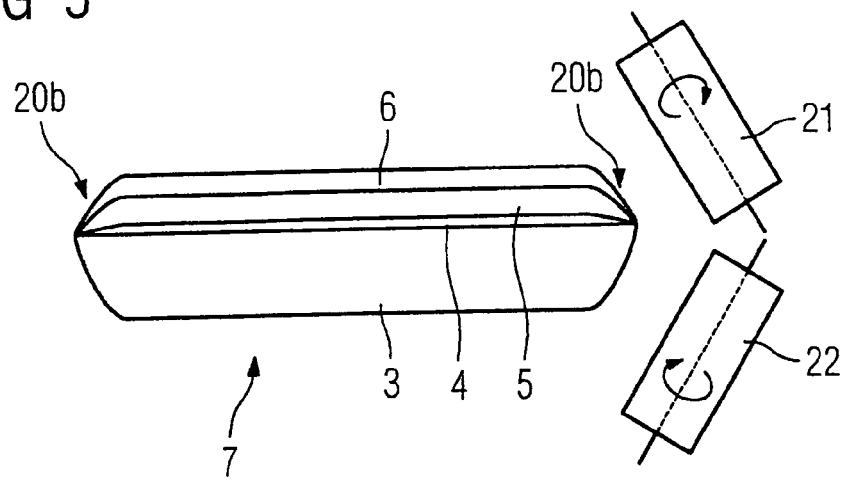
FIG. 5 shows an alternative embodiment to the configuration shown in FIG. 4 of a YBCO strip conductor, in a corresponding view.

By way of example, as shown in FIG. 5, the desired deformation can be carried out with the aid of edge rollers 21 and 22. The rollers in this case act on the respective side edges in the side areas 20a and/or 20b, in such a manner that the structure is compressed somewhat in the diagonal direction from there. In this case, the covering layer material is pressed against the mechanically more robust substrate strip, so that, at least in subareas of the longitudinal side of the conductor strip, a conductive connection is created between the metallic material of the covering layer 6 and the metallic material of the substrate strip 3.

It is, of course, also possible to use the variants as explained above for making contact with the YBCO layer 5 with its covering layer 6, which is located thereon, in close electrical contact with it, on the one hand, and the metallic substrate strip 3 on the other hand at the same time as one another.

The above exemplary embodiments have been based on YBCO as the HTS material for the superconducting layer 5. Other HTS materials of the so-called 1-2-3 type can, of course, also be used with other rare earth metals and/or other alkaline earth metals. The individual components of these materials may also be partially substituted in a manner known per se by further/other components.

The invention has been described in detail with particular reference to preferred embodiments thereof and examples, but it will be understood that variations and modifications can be effected within the spirit and scope of the invention covered by the claims which may include the phrase "at least one of A, B and C" as an alternative expression that means one or more of A, B and C may be used, contrary to the holding in Superguide v. DIRECTV, 69 USPQ2d 1865 (Fed. Cir. 2004).

The invention claimed is:

1. A superconducting current-limiter resistive device, comprising:
   a conductor track formed as a strip, the conductor track comprising:
      a substrate strip formed of a normally conductive substrate metal;
      a superconducting layer formed on the substrate strip, the superconducting layer being formed of an oxidic high-$T_C$ superconductor material of $AB_2Cu_3O_x$, with A being at least one element selected from the group consisting of rare earth metals and yttrium, and B being at least one alkiline earth metal;
      a buffer layer between the substrate strip and the superconducting layer, the buffer layer being formed of an oxidic buffer material; and
      a covering layer formed on the superconducting layer, the covering layer being formed of a normally conductive covering metal; and
   a spacer, the conductor track being in the form of a bifilar coil, the spacer being arranged between adjacent coil turns of the bifilar coil, the spacer creating a space for a coolant to flow, the spacer maintaining a constant distance between adjacent coil turns, the spacer being aligned along a flow direction of the coolant, wherein
   at least one electrical contact point is provided between the covering layer and the substrate strip,
   the bifilar coil formed from the conductor track and the spacer are mechanically intrinsically stable, and
   the bifilar coil and the spacer are adhesively bonded together only in mutually touching areas, with a synthetic resin, the conductor track and the spacer being bonded in sections so as to leave open coolant paths.

2. The current-limiter device as claimed in claim 1, wherein the conductor track is arranged with the substrate strip on an outside of the coil.

3. The current-limiter device as claimed in claim 1, wherein an insulation film is arranged in the bifilar coil, between the spacer and the conductor track adjacent to the spacer.

4. The current-limiter device as claimed in claim 1, wherein the spacer is a corrugated spacing film.

5. The current-limiter device as claimed in claim 1, wherein the bifilar coil has a mutual separation between adjacent the coil turns of at least 1 mm.

6. The current-limiter device as claimed in claim 1, wherein the covering layer is formed of a plurality of layers of metallic material.

7. The current-limiter device as claimed in claim 1, wherein the buffer layer is formed of a plurality of layers of different oxidic materials.

8. The current-limiter device as claimed in claim 1, wherein
   the at least one electrical contact point is formed by a contact-making element formed of a normally conductive contact-making material provided on a lateral edge of the conductor track, between the covering layer and the substrate strip, and
   the current-limiter device has a normally conductive limiting state governed by a relationship:

$$R_K > 3 \cdot R_L$$

where $R_L$ is an electrical resistance of the conductor track without the contact-making element formed over an entire length of the conductor track, and $R_K$ is an electrical resistance of the contact-making element if formed over the entire length of the conductor track.

9. The current-limiter device as claimed in claim 8, wherein the relationship is:

$$R_K > 10 \cdot R_L.$$

10. The current-limiter device as claimed in claim 8, wherein the contact-making element has an average thickness of less than 1 μm.

11. The current-limiter device as claimed in claim 8, wherein the contact-making element is formed of gold, silver, copper or an alloy of gold, silver and/or copper.

12. The current-limiter device as claimed in claim 8, wherein a soldering process is used to form the contact-making element.

13. The current-limiter device as claimed in claim 8, wherein the contact-making element is a sheathing element which surrounds the conductor track on all sides.

14. The current-limiter device as claimed in claim 13, wherein the sheathing element is an electrochemical coating.

15. The current-limiter device as claimed in claim 1, wherein
   the conductor track has lateral edges, and
   the at least one electrical contact point is at least one mechanically deformed region of the lateral edges.

16. The current-limiter device as claimed in claim 15, wherein the at least one mechanically deformed region is formed by crushing or rolling deformation.

17. The current-limiter device as claimed in claim 1, wherein the buffer layer is formed to produce an electrical conductivity between the superconducting layer and the substrate strip, at least in subareas, which is sufficient for potential equalization between the superconducting layer and the substrate strip.

18. The current-limiter device as claimed in claim 17, wherein the buffer layer produces a contact resistance of at most $10^{-3}$ Ω·cm².

19. The current-limiter device as claimed in claim 17, wherein the buffer layer has a mean resistivity of at most 5000 μΩ·cm².

20. The current-limiter device as claimed in claim 17, wherein the buffer layer is formed an oxidic material of La-Mn-O, Sr-Ru-O, La-Ni-O or In—Sn-O.

21. A superconducting current-limiter resistive device, comprising:
   a conductor track formed as a strip, the conductor track comprising:
      a substrate strip formed of a normally conductive substrate metal;
      a superconductor layer formed on the substrate strip, the superconductor layer being formed of an oxidic high-$T_c$ superconductor material of $AB_2Cu_3O_x$, with A being at least one element selected from the group consisting of rare earth metals and yttrium, and B being at least one alkiline earth metal;

a buffer layer between the substrate strip and the superconducting layer, the buffer layer being formed of an oxidic buffer material; and a covering layer formed on the superconducting layer, the covering layer being formed of a normally conductive covering metal; and a transparent spacer, the conductor track being in the form of a bifilar coil, the spacer, being arranged between adjacent coil turns of the bifilar coil, the spacer creating a space for a coolant to flow, the spacer maintaining a constant distance between adjacent coil turns, wherein at least one electrical contact point is provided between the covering layer and the substrate strip, the bifilar coil formed from the conductor track, and the spacer are intrinsically stable even without an additional mechanical support, and the bifilar coil and the spacer are adhesively bonded together only in mutually touching areas, with a synthetic resin, the conductor track and the spacer being bonded in sections so as to leave open coolant paths.

* * * * *